(12) United States Patent
Barrenscheen et al.

(10) Patent No.: US 8,004,442 B2
(45) Date of Patent: Aug. 23, 2011

(54) ANALOG TO DIGITAL CONVERTER (ADC) WITH COMPARATOR FUNCTION FOR ANALOG SIGNALS

(75) Inventors: Jens Barrenscheen, Munich (DE); Karl Johann Schretter, Radenthein (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/428,608

(22) Filed: Apr. 23, 2009

(65) Prior Publication Data

US 2010/0271250 A1  Oct. 28, 2010

(51) Int. Cl.
*H03M 1/10* (2006.01)
(52) U.S. Cl. .................................... 341/155; 341/172
(58) Field of Classification Search .............. 341/155, 341/150, 172
See application file for complete search history.

(56) References Cited

U.S. PATENT DOCUMENTS

| | | | | | |
|---|---|---|---|---|---|
| 3,153,142 | A | * | 10/1964 | Hellerman | 341/165 |
| 4,129,863 | A | * | 12/1978 | Gray et al. | 341/172 |
| 4,384,276 | A | * | 5/1983 | Kelley et al. | 341/150 |
| 4,412,208 | A | * | 10/1983 | Akazawa et al. | 341/145 |
| 4,454,500 | A | * | 6/1984 | Kato et al. | 341/108 |
| 4,458,237 | A | * | 7/1984 | Domogalla | 341/172 |
| 4,618,852 | A | * | 10/1986 | Kelley et al. | 341/172 |
| 5,006,853 | A | * | 4/1991 | Kiriaki et al. | 341/172 |
| 5,543,795 | A | * | 8/1996 | Fernald | 341/163 |
| 6,075,478 | A | * | 6/2000 | Abe | 341/155 |
| 6,653,963 | B1 | * | 11/2003 | Barrenscheen et al. | 341/155 |
| 7,423,565 | B2 | * | 9/2008 | Lavery et al. | 341/141 |

* cited by examiner

*Primary Examiner* — Howard Williams
(74) *Attorney, Agent, or Firm* — Lee & Hayes PLLC

(57) ABSTRACT

This disclosure relates to analog to digital converter (ADC) component with a comparator function for analog signals.

26 Claims, 3 Drawing Sheets

ANALOG TO DIGITAL CONVERTER (ADC) WITH COMPARATOR FUNCTION FOR ANALOG SIGNALS

BACKGROUND

Digital control applications may include analog input signals supplied to an analog to digital converter (ADC) component for conversion into a digital signal. The ADC component may be used in electronic field specifically data acquisition or data reproduction. The conversion may be based on a controlled timing sequence or based on various events. In the conversion of the analog input signals, a compare action by an analog comparator component may be required. The compare action may be performed against a reference value (i.e., analog signal or digital signal), which includes a previously sampled analog signal value or a programmed signal value from storage registers.

In an implementation, the compare action in an analog part of the ADC component may provide a successive approximation register (SAR) type of ADC component. Instead of measuring a subsequent analog signal value after the previously sampled analog signal value, the subsequent analog signal value may be compared against a digital result of a previously converted analog signal value. In other words, a digital output result may be derived from the comparator function of the ADC component in a short period of time (i.e., after one sampling and a compare step).

To further optimize the comparator function in the ADC component, a timing configuration for the conversion action and the compare action may be implemented for request signals. The request signals may come from different sources (e.g., timer, pin, etc.).

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

This disclosure is directed towards techniques and methods of performing analog to digital conversion with a compare function for analog signals. The analog to digital conversion may be implemented using switches, which configure a capacitor network, and a single analog comparator. The analog comparator compares a voltage value at a specific point in the capacitor network against a threshold value. The threshold value may be adjusted during each sampling phase and held constant during subsequent conversion steps or compare steps. Depending on a result of the compare action (i.e., analog comparator output), the capacitor network may be configured again for the next compare action by the analog comparator. A programmable process to select a conversion mode or compare mode is further illustrated.

Figure 1:
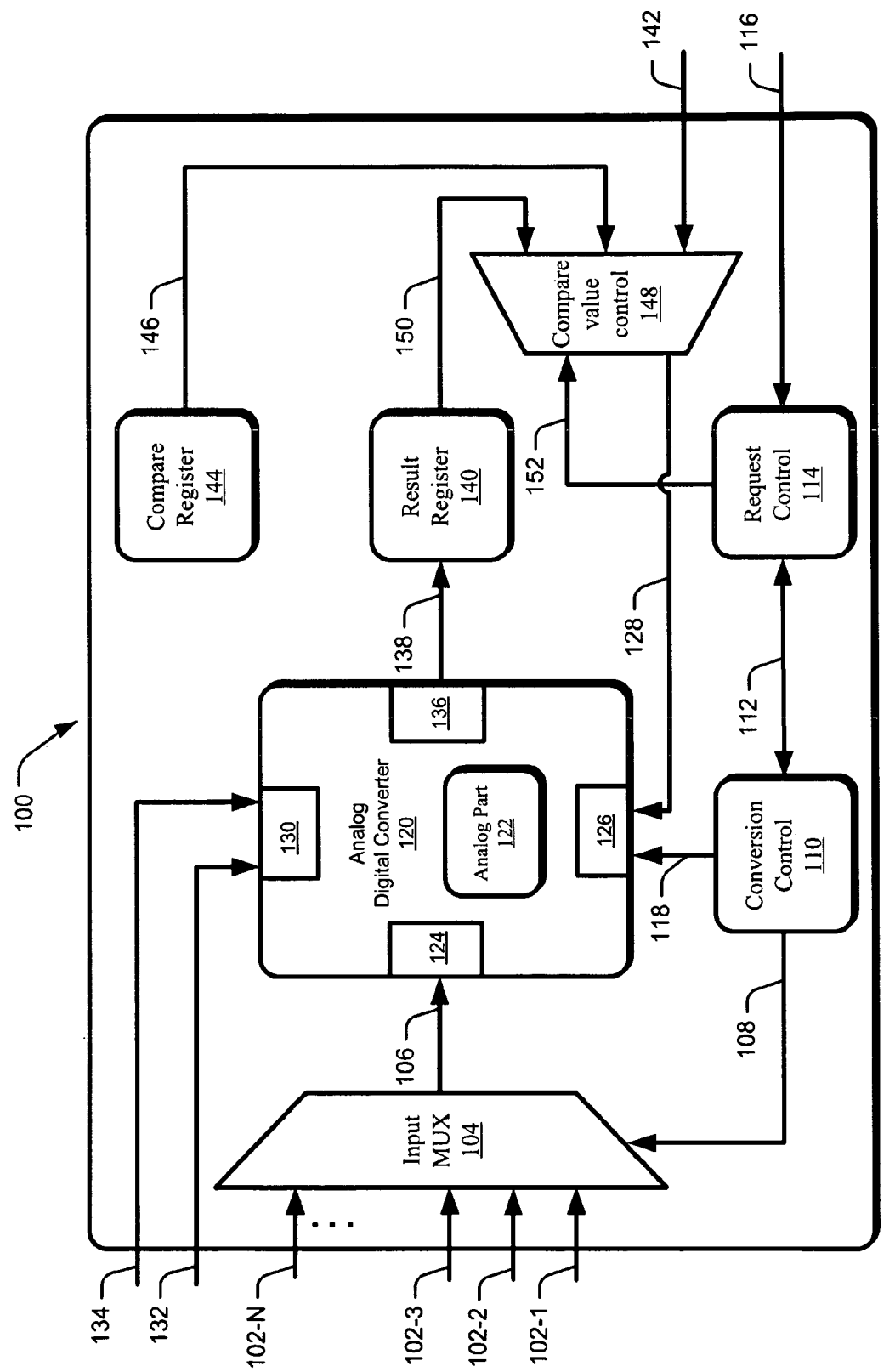
FIG. 1 is a block diagram of an analog to digital converter (ADC) module 100.

FIG. 1 illustrates an analog to digital converter (ADC) module 100 which converts an analog signal into a digital signal. The ADC module 100 is a system that includes a multiplexer component, an analog to digital converter, and control components to handle the conversion and data storage elements. The analog signal may include the signals from paths 102-1, 102-2, . . . 102-N, where "N" is an integer. The analog signals 102-1, 102-2, . . . 102-N may come from different sources (e.g., external sensor components) which may include data information to be acquired or reproduced. The analog signals 102-1, 102-2, . . . 102-N may be received by an input multiplexer component 104. The input multiplexer component 104 may provide a single output on path 106. The single output on path 106 may include an analog input value selected from the analog signals 102-1, 102-2, . . . 102-N. The analog signal on path 106 may include the first analog input value to be sampled, that is later to be compared and/or converted. The input multiplexer component 104 may receive a control signal on path 108 which includes an output of a conversion control component 110. The control signal on path 108 may include a selection of the analog input value to be sampled next. The selection and configuration of the analog input value may be programmable and may depend upon different events as further discussed below.

The conversion control component 110 may be triggered (e.g., to start a conversion) on path 112 by a request control component 114. The request control component 114 may allow automatic conversion of a sequence of selected analog signals, one after the other. The request control component 114 may further allow the analog signals to be addressed individually for conversion, if desired. The path 112 may further include a trigger and feedback information (e.g., previous conversion finished, start request for new conversion, etc.) between the conversion control component 110 and the request control component 114. The request control component 114 output may include a controlled timing sequence that is linked to a comparator function and a compare value. The timing sequence which includes an order of priorities by which different requests and analog signals are processed controls the comparator function and the compare value. The controlled timing sequence may further request if the conversion action and or compare action will be implemented.

In an external side of the ADC module 100, a request signal (e.g., from a timer, pin, etc.) on path 116 may include a synchronization mechanism to execute analog to digital conversions depending on different events. For example, the request signal from the timer on path 116 provides a request signal to perform individual conversion of the analog signals 102-1, 102-2, . . . 102-N. The request control component 114 may trigger the conversion control component 110 to implement the request signal on path 116.

The conversion control component 110, or selection means, may supply the control signals along path 118 to an analog to digital converter component 120. The control signals on path 118 may determine whether the comparator function (i.e., compare mode), analog to digital conversion (i.e., conversion mode), or both, is carried out by the analog-digital converter component 120. Depending upon application needs (e.g., conversion action, compare action, or both), the selection means (conversion control component 110) may include a changeable configuration to implement the conversion action and/or compare action. The changeable configuration may be programmable. The control signals on path 118 may further include timing information for the execution of the steps of the conversion or compare sequences. For example, a period of a sampling phase which may relate to a type of connected component at the respective analog input pin (e.g., output impedance of a sensor). The analog-digital converter component 120 may include an analog part 122, analog input port 124, digital input port 126, reference voltage input port 130, and a digital output port 136.

The analog part 122 may include a capacitor network that includes a set of capacitors, switches, a comparator, and a sequence control block for the step-by-step analog to digital conversion. The analog part 122 is further discussed below in FIG. 2. The analog input port 124 may receive the analog input value (i.e., analog input signal) on path 106. The analog input value may include a selection of the analog signals 102-1, 102-2, . . . 102-N. At least one analog input value may be used for the conversion action or the compare action. In an implementation, the analog input port 124 may supply a single analog input value to a single ADC component (e.g., analog-digital converter component 120), and the analog input value is compared and or converted, depending upon the application needs.

The digital input port 126 may receive the control signals on path 118 and a digital compare value on path 128. The digital compare value on path 128 may include a predetermined programmed value or an external programmable value. The digital compare value on path 128 may further include a conversion result (i.e., digital word) of the analog input value. To perform the compare action of the analog input value, the digital compare value on path 128 is received by the analog part 122.

The reference voltage input port 130 may receive the voltage reference for the analog input value in the analog to digital converter component 120. The voltage reference may include an analog reference ground on path 132, and an analog reference voltage on path 134. The analog reference ground on path 132 and the analog reference voltage on path 134 may connect to the switches of the analog part 122.

The digital output port 136 may supply on path 138 a digital output value of the compare action or the conversion action (i.e., conversion result). The digital output value on path 138 may be received by a result register component 140. The register component 140 may store the digital output value of a converted analog input value that may be used as a base of the digital compare value 128 for compare action with another analog input value (e.g., another analog signal from the single output 106). To this end, the two analog input values may be compared against each other that have been sampled at different points in time. For example, a sampling point of the first analog input value is made at the beginning of the conversion sequence, while a sampling point of the second analog input value is made at the beginning of the compare sequence. In an implementation, the conversion sequence and the compare sequence may be triggered by different events (e.g., by different timers) from the request control component 114. In other words, the sampling of the analog input values may be scheduled in a way to minimize noise effects in an input side of the analog to digital converter component 120.

In an implementation, the digital compare value 128 may be modified with an offset, depending on a result of a previous compare action. In other words, the conversion result may be modified before it is applied as the digital compare value for the compare action of the digital compare value (i.e., derived from the conversion result) with another analog input value. To this end, a hysteretic compare behavior between two analog input values may be achieved.

The analog input value may be compared to a digital value of an external signal on path 142, or compared to a value of a compare register component 144. The external signal on path 142 may include the digital value from another external component (e.g., another ADC component), or a predetermined programmed value. The compare register component 144 may also be programmed to contain a predetermined digital value that passes through signal path 146. The predetermined digital value on path 146 may be received by a compare value control component 148 as a potential input value. The compare value control component 148 may receive a digital value (e.g., converted analog signal) from the result register component 140 through a signal path 150. In an implementation, timing of the sampling of a conversion result of the analog input value may be related to the compare action of the digital compare value (i.e., derived from the conversion result) with another analog input value on path 106. The timing of the sampling of the conversion result may be configured independently to the compare action of the digital compare value with another analog input value on path 106.

The compare value control component 148 may produce the digital compare value from a multi-channel input through the aid of a control signal on path 152. The control signal on path 152 is supplied by the request control component 114. To this end, different digital compare values (e.g., from different sources) may be applied for different analog input values that have been selected for the compare action (e.g., analog input value 102-1 is compared against result register 140, 102-2 against contents of the compare register 144, etc.).

Figure 2:
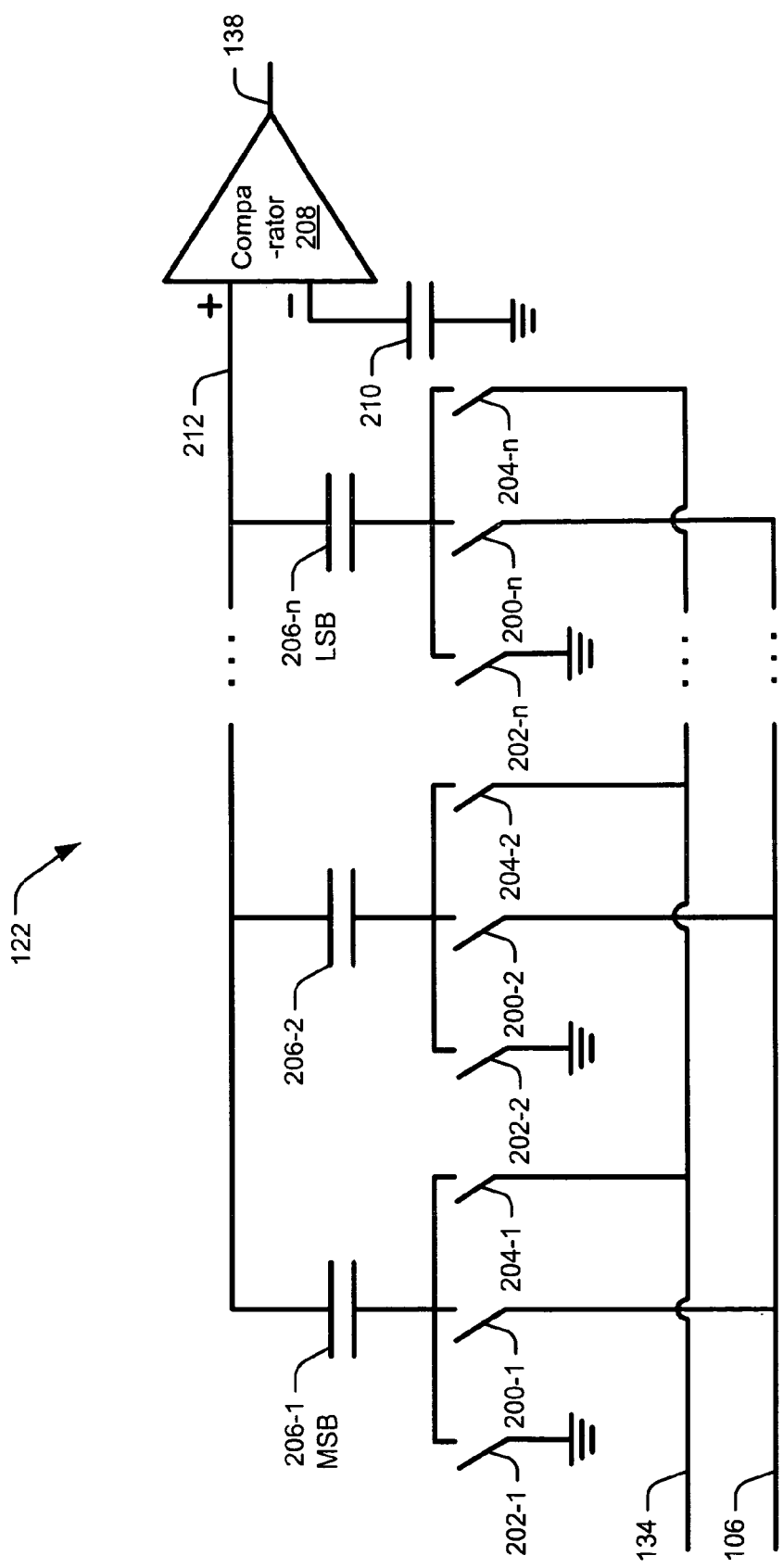
FIG. 2 is a block diagram illustrating an analog part of an analog-digital converter (ADC) component.

FIG. 2 illustrates an exemplary analog part 122 which includes a selected analog input value 106; sampling switches 200-1, 200-2, . . . 200-n; analog reference ground switches 202-1, 202-2, . . . 202-n; analog voltage reference switches 204-1, 204-2, . . . 204-n; capacitors 206-1, 206-2, . . . 206-n; an analog comparator component 208; and a threshold capacitor 210. The variable "n" represents a number of bits in a word.

During a sampling phase of the analog input value (i.e., from path 106), the sampling switches 200-1, 200-2, . . . 200-n may be closed to charge the capacitors 206-1, 206-2, . . . 206-n according to a voltage level of the sampled analog input value. At this sampling phase, the analog reference ground switches 202-1, 202-2, . . . 202-n, and the analog voltage reference switches 204-1, 204-2, . . . 204-n are open. The capacitors 206-1, 206-2, . . . 206-n, which are all connected in parallel, are charged through the voltage level coming from the analog input value. The comparator component 208 may include no voltage difference at this sampling phase, since the threshold capacitor 210 holds the same voltage as the rest of the capacitors 206-1, 206-2, . . . 206-n.

After the sampling phase, the sampling switches 200-1, 200-2, . . . 200-n, may be opened. In certain embodiments, a measurement sequence of the analog input value involves a bit by bit sequence. In other words, a first step includes the capacitor 206-1 as connected to the analog voltage reference switch 204-1 and the rest of the capacitors 206-2, 206-3, . . . 206-n are respectively connected to the analog reference ground switches 202-2, 202-3, . . . 202-n. After the compare action for the first step is performed (i.e., first bit compare result), the sequence control block will either connect capacitor 206-1 as a most significant bit (MSB) to the analog reference ground switch 202-1 or to the analog voltage reference switch 204-1. A second conversion step in the conversion sequence involves capacitor 206-2, a third conversion step involves capacitor 206-3 and so on up to the capacitor 206-n being a least significant bit (LSB). The conversion sequence is finished when a correct setting has been elaborated for each of the capacitors 206-1, 206-2, . . . 206-n. In an implementation, the conversion sequence as described includes "n" conversion steps from the MSB up to the LSB. As a result, a digital word may be produced after the "n" conversion sequences have been executed.

To perform the compare action in the analog part 122 of FIG. 2, the digital compare value on path 128 is applied to the switches (i.e., connecting parts) configuring the capacitor network (i.e., capacitor array). The digital compare value on path 128 may include the conversion result of the analog input value. The application to the switches may be performed after the sampling of the analog input value. In an implementation, a zero (0) value in the MSB position of the digital compare value leads to the switch 202-1 being closed, and the switch 204-1 being open. In contrast, a one (1) value in the MSB position of the digital compare value leads to the switch 202-1 being open and the switch 204-1 being closed. To this end, a common point on path 212 for all capacitors 206-1, 206-2, ... 206-*n*, may show a different resulting voltage than the voltage stored in the threshold capacitor 210. The resulting voltage on path 212 is an analog representation of the applied digital compare value (i.e., with respect to the analog reference voltages). The digital output of the comparator 208 now indicates whether the previously sampled analog input voltage (i.e., stored at threshold capacitor 210) is bigger or smaller than the voltage on path 212. The compare action may be implemented in a single step.

The result of the compare action in the comparator component 208 may be stored in a flag (e.g., in the result register component 140). The sequence of the compare action involves one step of a sequence for the sampling of the analog input value to be compared, and another step of the sequence for the compare action. To this end, the compare action is implemented using the controlled timing sequence.

Figure 3:
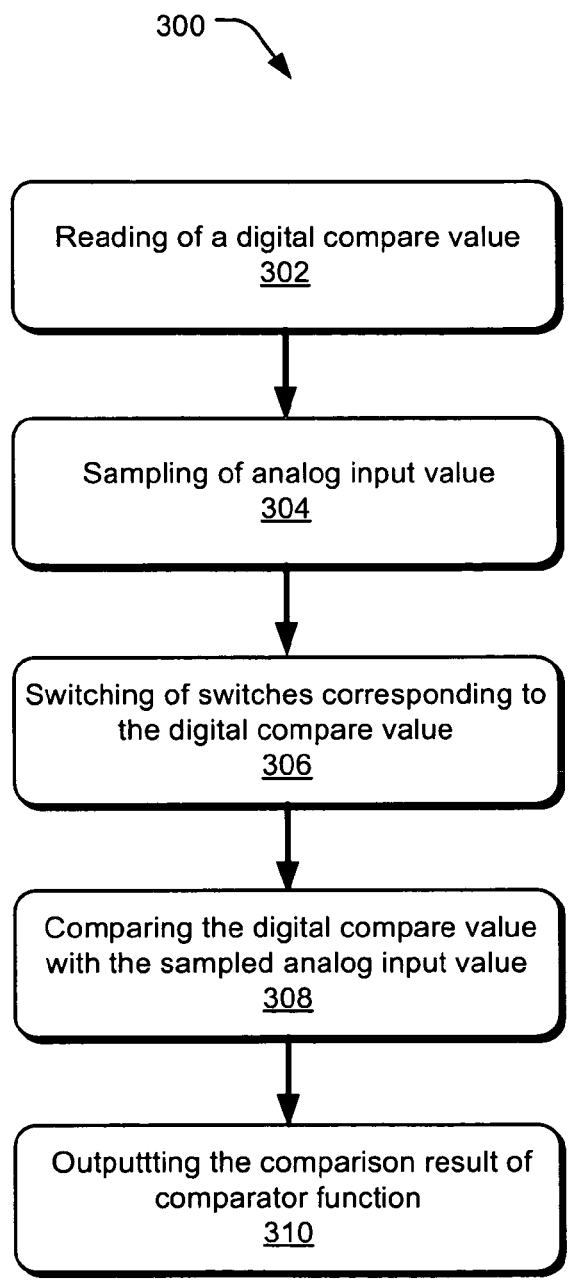
FIG. 3 is a flow chart illustrating a process for analog to digital conversion with a comparator function for analog signals.

FIG. 3 illustrates an exemplary method 300 for analog to digital conversion with comparator function for analog signals. In one implementation, the exemplary method 300 can be implemented in the analog to digital converter (ADC) module 100 wherein at least an order "sampling" and then "compare" has to be respected. The exemplary method 300 is described with reference to FIGS. 1-2. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method can be implemented in any suitable hardware, software, firmware, or a combination thereof, without departing from the scope of the invention.

At step 302, reading of a digital compare value is performed (e.g., selection and transfer from a storage location to the ADC). For example, the digital compare value is selected by a multiplexer (e.g., compare value control component 148) from a plurality of different storage locations (e.g., result register, compare register, external path).

At step 304, sampling is performed. In an implementation, an analog part of analog-digital converter (e.g., analog part 122) may be used to sample an analog input value (e.g., analog input value on path 106). A capacitor network in the analog part is charged to an input voltage level during the sampling of the analog input value. In addition, a threshold voltage capacitor (e.g., threshold capacitor 210) stores this information (i.e., input voltage level).

At step 306, switching of switches is performed (e.g., switches are configured corresponding to a binary weight of the digital compare value). In an implementation, a set of analog reference ground switches and a set of analog voltage reference switches in the analog part (e.g., analog voltage reference switch 204-1, 204-2, ... 204-*n* and analog reference ground switches 202-1, 202-2, ... 202-*n* in analog part 122) are directly connected in a closed state or open state according to the binary weight representation of the digital compare value.

At step 308, comparing voltages is performed (e.g., the resulting voltage value at the capacitor network is compared with the threshold voltage established during the sampling of the analog input value). In an implementation, a comparator (e.g., comparator component 208) may be used to compare whichever is larger between the resulting voltage value and the threshold voltage.

At step 310, outputting a comparison result is performed. For example, the comparator (e.g., comparator component 208) compares whichever is larger between the resulting voltage value and the threshold voltage and provides a digital output value as a result.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

What is claimed is:

1. An analog to digital converter (ADC) component comprising:
    an analog input port that receives an analog input value;
    a reference voltage input port that receives a reference voltage for the analog input value;
    a digital input port that receives a digital compare value;
    a digital output port that provides a digital output value;
    wherein the ADC component is operable to selectively perform in a conversion mode a conversion action of the analog input value to provide the digital output value, or to perform in a compare mode a compare action of the analog input value against the digital compare value;
    a capacitor network including a plurality of capacitors, each of the plurality of capacitors being coupled to a respective switch, wherein each respective switch is coupled to the analog input port and the ADC component is operable to charge each of the plurality of capacitors to establish a first voltage at a first input of a comparator by coupling each of the plurality of capacitors to the analog input port, the first voltage having a voltage level that is approximately the same as a voltage level of a second voltage established at a second input of the comparator.

2. The ADC component of claim 1, wherein the ADC component includes a selection means for the conversion mode or the compare mode.

3. The ADC component of claim 2, wherein the selection means is configured for the conversion mode or the compare mode, for at least one analog input value.

4. The ADC component of claim 2, wherein the selection means includes a configuration changeable according to application needs.

5. The ADC component of claim 2, wherein the selection means includes a programmable configuration.

6. The ADC component of claim 1, wherein the digital input port receives the digital compare value derived from a conversion result of a previous analog input value.

7. The ADC component of claim 6, wherein timing of a sampling of the conversion result is related to an additional compare action of the digital compare value with another analog input value.

8. The ADC component of claim 6, wherein timing of a sampling of the conversion result is configured independently to an additional compare action of the digital compare value with another analog input value.

9. The ADC component of claim 1, wherein each of the plurality of capacitors is further coupled to a respective analog reference voltage switch and a respective analog reference ground switch, and wherein one or more of the respective switches is operated during a sampling phase and either at least one respective analog reference ground switch or at least one respective analog voltage reference switch is operated during a measurement phase.

10. The ADC component of claim 1, further comprising a comparator and an additional capacitor, wherein the capacitor network is coupled to a first input of the comparator, and the additional capacitor is coupled to a second input of the comparator, wherein the ADC is operable to establish a first voltage at the first input of the comparator and a second voltage at the second input of the comparator, the first voltage having a voltage level that is approximately the same as a voltage level of the second voltage during a sampling phase.

11. The ADC component of claim 10, wherein the additional capacitor stores the voltage level established during the sampling phase and applies the voltage level established during the sampling phase to the second input of the comparator when the conversion action is selected or when the compare action is selected.

12. The ADC component of claim 1, wherein the ADC component is operable to compare a first analog input voltage sampled at a first sampling point with a second analog input voltage sampled at a second sampling point.

13. The ADC component of claim 12, wherein the first sampling point is the beginning of an analog to digital conversion action and the second sampling point is the beginning of a compare action.

14. The ADC component of claim 1, wherein the ADC component starts a conversion action when selected or a compare action when selected after opening of each respective switch.

15. An analog to digital conversion system comprising:
an analog input port that provides an analog input value;
an analog to digital converter (ADC) component connected to the analog input port, that selectively performs a conversion action of the analog input value into a digital value, or a compare action of the analog input value with a digital compare value;
a conversion control component supplying a control signal to the ADC component; a compare value control component that provides the digital compare value to the ADC component; and
a comparator including a first input and a second input, wherein the analog to digital conversion system is operable to establish via the analog input port a first voltage at the first input of the comparator and a second voltage at the second input of the comparator, the first voltage having a voltage level that is approximately the same as a voltage level of the second voltage.

16. The analog to digital conversion system of claim 15, wherein the ADC component includes a selection means to perform the conversion action or the compare action.

17. The analog to digital conversion system of claim 15, wherein the digital compare value is programmable.

18. The analog to digital conversion system of claim 17, wherein the digital compare value is derived from one of the following: an external path, a result register, or a compare register.

19. The analog to digital conversion system of claim 15, wherein the ADC component includes a conversion result modified before applied as the digital compare value for an additional compare action of the digital compare value with another analog input value.

20. The analog to digital conversion system of claim 19, wherein the modification of the conversion result when applied as the digital compare value depends upon a result of a previously performed compare action.

21. A method of implementing analog to digital conversion with comparator functions for analog signals comprising:
providing an analog input value to an analog input port of an analog to digital converter;
reading a digital compare value;
sampling the analog input value by switching one or more sampling switches to connect a capacitor network with the analog input port and to establish a first voltage at a first input of a comparator of the analog to digital converter and a second voltage at a second input of the comparator, the first voltage having a voltage level that is approximately the same as a voltage level of the second voltage;
switching the one or more analog reference ground switches or the one or more analog voltage reference switches or a combination thereof corresponding to the digital compare value to provide a resulting voltage;
comparing the resulting voltage with the second voltage stored in an additional capacitor to produce a comparison result; and
outputting the comparison result.

22. The method of claim 21, wherein the reading of the digital compare value is derived from one of the following: a result register component, a compare register component, or external sources.

23. The method of claim 21, wherein the digital compare value is programmable.

24. The method of claim 21, wherein the one or more sampling switches, the one or more analog reference ground switches, and the one or more analog voltage reference switches are directly connected to the capacitor network.

25. The method of claim 21, further comprising sampling an additional analog input value to derive the digital compare value from a conversion of the analog input value.

26. The method of claim 21, wherein the comparing of the resulting voltage with the threshold voltage is implemented using a controlled timing sequence.

* * * * *